United States Patent
Chevallier et al.

[19]

[11] Patent Number: 6,046,615
[45] Date of Patent: *Apr. 4, 2000

[54] LEVEL DETECTION CIRCUIT

[75] Inventors: Christophe J. Chevallier, Palo Alto; Frankie F. Roohparvar, Cupertino; Michael S. Briner, San Jose, all of Calif.

[73] Assignee: Micron Technology, Inc., Boise, Id.

[*] Notice: This patent is subject to a terminal disclaimer.

[21] Appl. No.: 09/094,825

[22] Filed: Jun. 15, 1998

Related U.S. Application Data

[63] Continuation of application No. 08/717,702, Sep. 23, 1996, Pat. No. 5,767,711, which is a continuation of application No. 08/509,021, Jul. 28, 1995, Pat. No. 5,581,206.

[51] Int. Cl.[7] .............................. H03L 7/00; H03K 5/22
[52] U.S. Cl. ............................ 327/143; 327/77; 327/89
[58] Field of Search ..................................... 327/142, 143, 327/198, 72, 77–81, 87, 88, 89, 530, 538, 543, 545, 546, 227, 228, 229, 230

[56] References Cited

U.S. PATENT DOCUMENTS

| | | | |
|---|---|---|---|
| 4,041,333 | 8/1977 | Porat | 327/581 |
| 4,309,627 | 1/1982 | Tabata | 307/362 |
| 4,437,025 | 3/1984 | Liu et al. | 307/475 |
| 4,584,492 | 4/1986 | Sharp | 307/475 |
| 4,658,156 | 4/1987 | Hashimoto | 307/350 |
| 4,922,133 | 5/1990 | Iwahashi et al. | 307/363 |
| 5,083,045 | 1/1992 | Yim et al. | 307/350 |
| 5,097,146 | 3/1992 | Kowalski et al. | 307/350 |
| 5,124,590 | 6/1992 | Liu et al. | 326/60 |
| 5,144,159 | 9/1992 | Frisch et al. | 307/272 |
| 5,214,316 | 5/1993 | Nagai | 307/272 |
| 5,278,458 | 1/1994 | Holland et al. | 307/272 |
| 5,280,198 | 1/1994 | Almulla | 307/296 |
| 5,378,936 | 1/1995 | Kokubo et al. | 327/77 |
| 5,469,100 | 11/1995 | Wuidart et al. | 327/262 |
| 5,581,206 | 12/1996 | Chevallier et al. | 327/143 |
| 5,767,711 | 6/1998 | Chevallier et al. | 327/143 |

FOREIGN PATENT DOCUMENTS 3206709  9/1991  Japan .

*Primary Examiner*—Toan Tran
*Attorney, Agent, or Firm*—Schwegman, Lundberg, Woessner & Kluth, P.A

[57] ABSTRACT

A level detection circuit for monitoring the level of a power supply voltage and producing an output signal at power on for resetting various system elements powered by the supply voltage when the supply voltage reaches a predetermined level. The detection circuit, which is powered by the supply voltage includes a voltage reference circuit which produces a reference voltage having a magnitude which is relatively independent of the power supply voltage. A translator circuit functions to produce a translated voltage indicative of the supply voltage magnitudes and which is comparable in magnitude to the reference voltage when the supply voltage is at a suitable level such that the system will accept a power on reset pulse. A comparator circuit functions to compare the reference voltage with the translated voltage and cause an associated output circuit to issue the reset pulse. The reset circuit typically includes a one shot circuit, the output of which is logically ORed with the amplified comparator output. The amplified comparator output functions to hold the system elements in a reset state at very low supply voltages and the one shot output functions to reset the system elements once the supply voltage is at a sufficiently high level.

37 Claims, 2 Drawing Sheets

LEVEL DETECTION CIRCUIT

This application is a continuation of U.S. patent application Ser. No. 08/717,702, filed Sep. 23, 1996 now U.S. Pat. No. 5,767,711, which is a continuation of Ser. No. 08/509,021, filed Jul. 28, 1995, now U.S. Pat. No. 5,581,206.

BACKGROUND OF THE INVENTION

1. Field of the Invention

The present invention relates generally to the field of level detection circuitry and in particular to circuitry for detecting the level of an input signal, such as a power supply voltage, which is also powered by the input signal.

2. Background of Related Art

Most electronic systems contain storage elements which have indeterminate states when the primary power source for the system is first applied or when the power source drops below some minimum operating level. Accordingly, it is often necessary to provide some means whereby the storage elements are set to a known state at initial power on or after a power drop. Such circuits are sometimes referred to as power on reset circuits.

One difficulty in implementing power on reset circuits is that such circuits must often be powered by the same voltage source that is monitored by the circuit. This can present a challenge, particularly if the circuit must ensure that the system is in a proper initial state at relatively low supply voltages. Furthermore, such reset circuits must operate reliably when the input supply voltage either has a very fast rise time or a slow rise time.

The present invention is capable of detecting input signals, such as power supply voltages, while being powered by such input signals. The input signal level is reliably and accurately detected and an output is provided to accommodate input signals having fast and slow rising inputs. These and other advantages of the present invention will be apparent to those skilled in the art upon a reading of the following Detailed Description of the Invention together with the drawings.

SUMMARY OF THE INVENTION

A level detection circuit for producing an detection output when an input signal reaches a predetermined level is disclosed. Typically the input signal is the primary power supply voltage of an electronic system reset by the detection circuit output at power on and at low power supply voltages. The detection circuit includes a voltage reference circuit means for producing a reference voltage having a magnitude which is relatively independent of the input signal magnitude once the input signal has reached a first operating voltage.

The level detection circuit further includes translator circuit means for producing a translated voltage having a magnitude which is indicative of the magnitude of the input signal. Preferably, this element includes a series-connected MOS transistor and a resistor, with the output of the translator circuit means being produced at the junction of these two devices. A comparator means is provided for comparing the reference voltage and the translated voltage and for producing a comparator output based upon the comparison. The comparator means is powered by the input signal. The remaining elements of the subject detection circuit are also typically powered by the input signal. In addition, output means is used for producing the detection output signal in response to the comparator output. The output means preferably includes some form of pulse shaping circuitry such as an inverter followed by a one shot circuit.

DETAILED DESCRIPTION OF THE INVENTION

Figure 1:
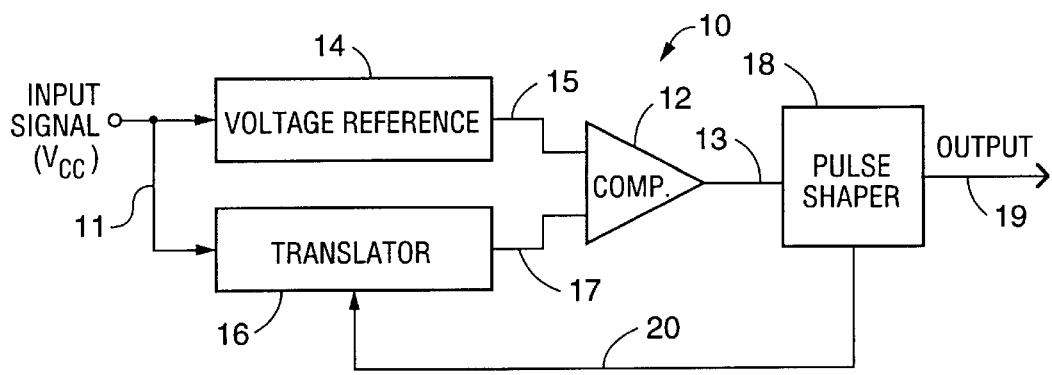
FIG. 1 is a simplified block diagram of the present invention.

Referring to the drawings, FIG. 1 is a block diagram of the subject Level Detection Circuit 10. The Input Signal on line 11 can be, by way of example, the primary supply voltage $V_{cc}$ for the system. In that event, all of the various elements of the system are also powered by the Input Signal. Circuit 10 includes a Comparator circuit which compares the output of a Voltage Reference circuit 14 on line 15 and the output of a Translator circuit 16 on line 17. The Translator circuit provides an output indicative of the magnitude of the Input Signal. When the output of the Translator circuit 16 exceeds that of the Voltage Reference 14, the Comparator circuit 12 output on line 13 changes state thereby indicating that the Input Signal is at a predetermined minimum voltage level (trip point level). A Pulse Shaper circuit 18 converts the output of the Comparator circuit 12 to the Detection Circuit 10 output on line 19 in the form of a pulse suitable for resetting the various logic elements of the associated system powered by Input Signal $V_{cc}$. All of the elements of the subject Level Detection circuit 10 are typically implemented in a common integrated circuit.

The function of the Voltage Reference circuit 14 is to produce a reference voltage which is relatively independent of the Input Signal $V_{cc}$. Since the Voltage Reference circuit 14 is powered by the Input Signal in the present example, the output reference voltage will not be produced until the Input Signal reaches some minimum value. To ensure proper operation of the Detection Circuit 10, that minimum value of Input Signal must be less than the trip point level of the Detection Circuit 10. The phrase "relatively independent" means that a variation in the Input Signal produces a corresponding variation in the magnitude of the Voltage Reference circuit output which is 30% or less than that of the Input Signal. For example, if the Input Signal has a nominal value of +3.3 volts and varies 50% (1.65 volts) and the output reference voltage has a nominal value of +0.8 volts, the reference voltage output can vary only 15% (0.12 volts) or less (30% of 50%) in order to be considered relatively independent of the Input Signal.

As previously noted, the Translator circuit 16 functions3 to produce an output signal which is indicative of the magnitude of the Input Signal. The magnitude of the output of Translator circuit 16 is selected to be equal to that of the Voltage Reference circuit 14 when the Input Signal is at the trip point level.

Figure 2:
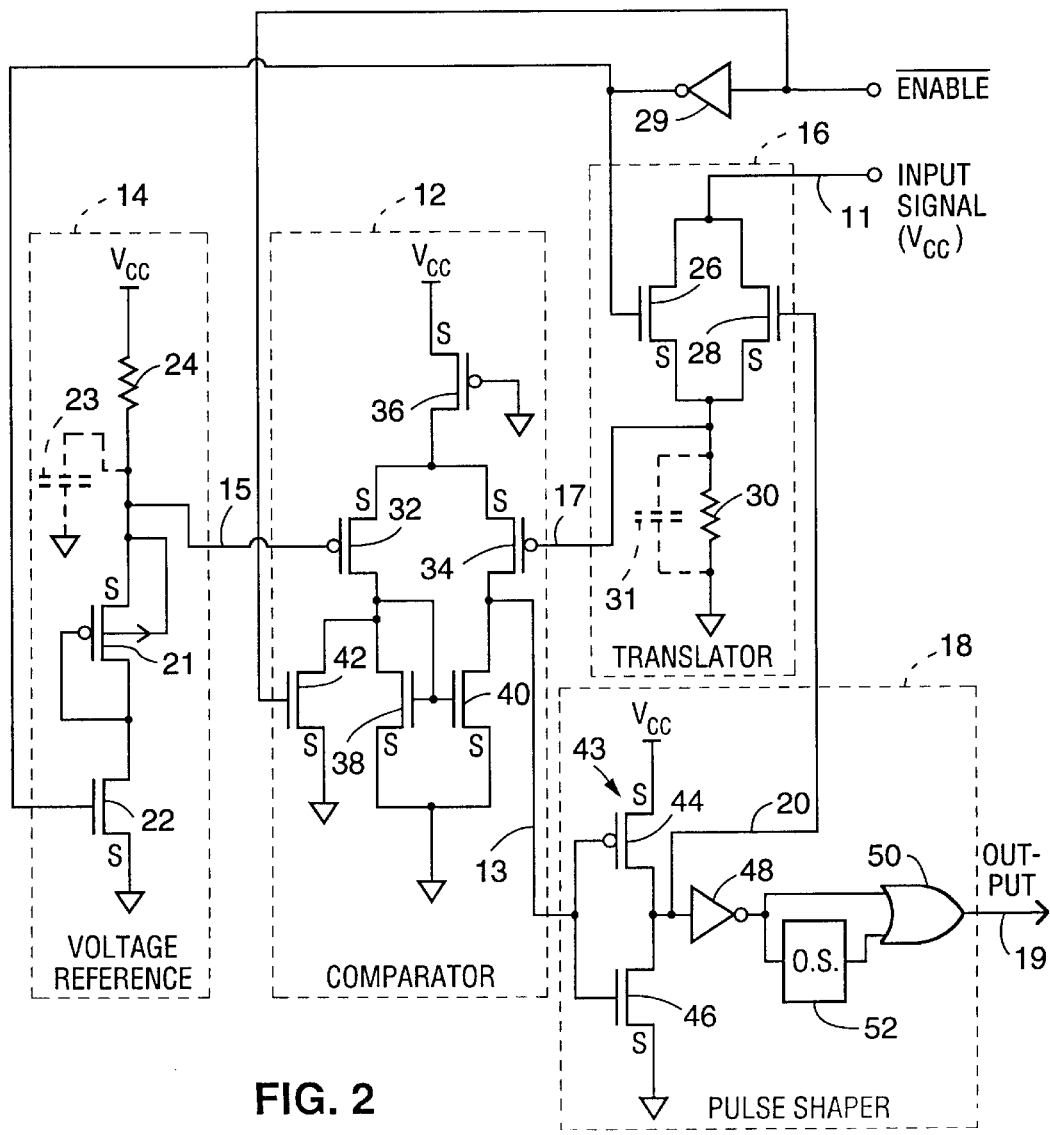
FIG. 2 is a detailed schematic diagram of the present invention.

FIG. 2 is an exemplary implementation of the FIG. 1 circuit. The Voltage Reference circuit 14 includes a diode-connected P channel transistor 21 connected in series with an N channel transistor 22. As will be explained, when the system is enabled, transistor 22 is conductive so that the drain of transistor 21 is effectively connected to the circuit common. The source and body (N well) of transistor 21 is connected to the Input Signal $V_{cc}$ by way of a resistor 24 for the purpose of powering the Voltage Reference circuit 14. A small parasitic capacitor 23 is associated with resistor 24. The output of the Voltage Reference circuit 14 at the junction of transistor 21 and resistor 24 is connected to one input of Comparator circuit 12 by way of line 15.

The Translator circuit 16 of FIG. 2 includes a pair of N channel transistors 26 and 28 connected in parallel, with the drain of both transistors connected to the Input Signal $V_{cc}$ on line 11. The common sources of transistors 26 and 28 are connected to one terminal of a resistor 30 and to the remaining input of Comparator circuit 12 by way of line 17. The other terminal of resistor 30 is connected to the circuit common. A small parasitic capacitor 31 is associated with resistor 30. As will be explained, in normal operation, and at low levels of the Input Signal, transistor 26 is conductive and transistor 28 is off. A voltage will be generated on line 17 indicative of the magnitude of the Input Signal. Transistor 28 will be made conductive once the Input Signal reaches the trip point level so as to provide hysteresis, as will also be explained.

The Comparator circuit 12 includes a pair of differentially-connected P channel transistors 32 and 34. The common sources of transistors 32 and 34 are connected to a tail current source formed by a P channel transistor 36. The source of transistor 36 is connected to Input Signal $V_{cc}$ for the purpose of powering the Comparator circuit 12. Circuit 12 includes a current mirror load comprising N channel transistors 38 and 40 having their sources connected to the circuit common. Transistor 38 is connected as a diode, with the drain and gates connected together and to the drain of input transistor 32. Transistor 40 has its gate connected to the gate-drain of transistor 38 and its drain connected to the drain of input transistor 34 and to the Comparator circuit output on line 13. As will be explained, an N channel transistor 42 is connected in parallel with load transistor 38, with transistor 42 being off in normal operation.

The Pulse Shaper circuit 18 includes an inverter circuit 43 comprising a P channel transistor 44 and an N channel transistor 46 with their common gates connected together to receive the output of the Comparator Circuit on line 13. The inverter 43 is powered by the Input Signal $V_{cc}$. The output of the inverter 43 at the common drain connection of transistors 44 and 46 on line 20 is connected to one input of an OR gate 50 by way of inverter 48. The output of inverter 48 is also connected to the input of a One Shot circuit 52, with the output of the One Shot being connected to another input of OR gate 50. One Shot 52 is implemented to trigger on a falling edge of the input and produce a fixed duration output pulse. In addition, the output on line 20 is connected to the gate of transistor 28 to provide hysteresis. The output of OR gate 19 provides the Output of the Level Detection circuit 10 on line 19.

Figure 3A:
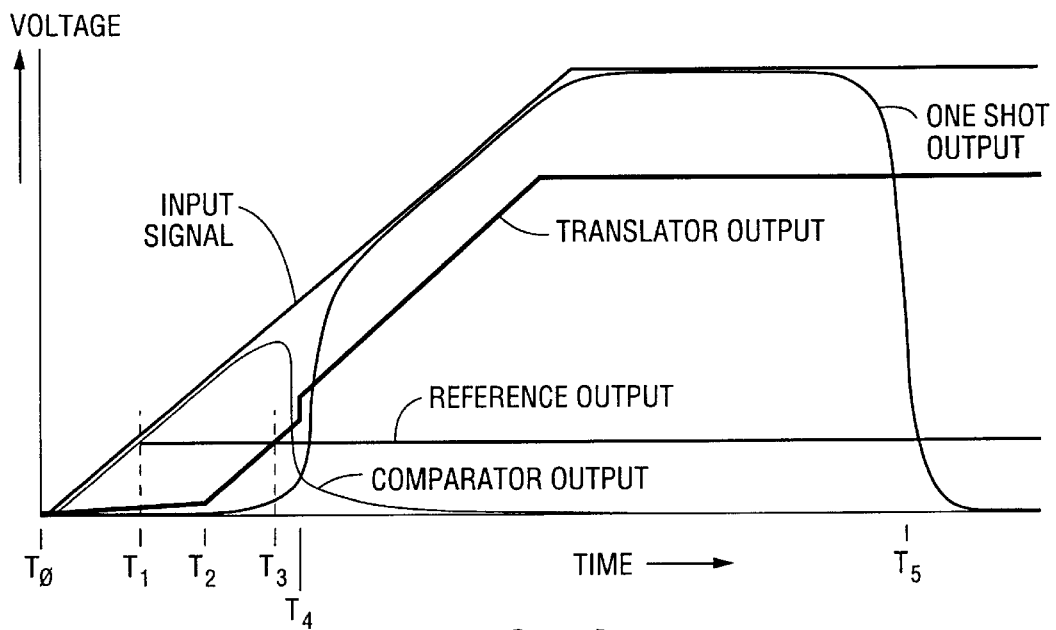
FIGS. 3A and 3B are timing diagrams illustrating the operation of the present invention.
Figure 3B:
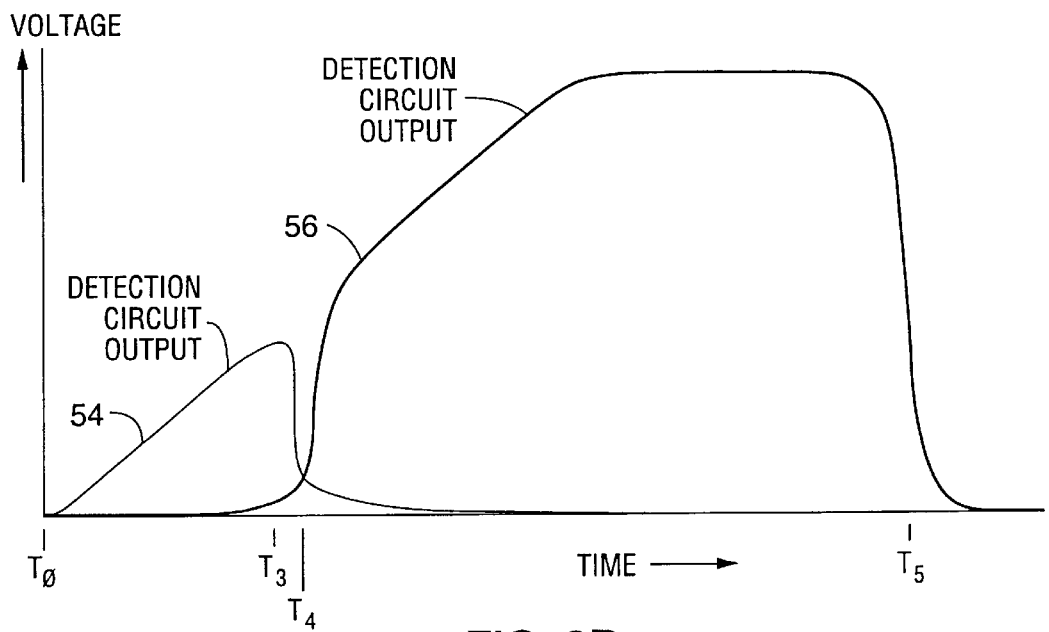

Having described the construction of the Level Detection circuit, operation of the circuit will now be explained. Reference will be made to both FIG. 2 and the FIGS. 3A and 3B timing diagrams. The FIG. 3A timing diagram depicts five signals, including the Input Signal $V_{cc}$ on line 11, the Voltage Reference circuit output on line 15, the Translator circuit Output on line 17, the Comparator circuit output on line 13 and the One Shot circuit 52 output. FIG. 3A illustrates operation when power in the form of voltage $V_{cc}$, the Input Signal, is first applied at time $T_0$. At this point, an $\overline{ENABLE}$ signal which is active low, is made active so that the Level Detection circuit will perform its normal function. The $\overline{ENABLE}$ signal is made high for the purpose of disabling various one of the system circuits in order to reduce power consumption in certain low power modes of operation. The timing diagram of FIG. 3B illustrates the two signals that are logically ORed together to form the Level Detection circuit 10 output on line 19. The first signal 54 is essentially the output of the Comparator circuit 12 and the second signal 56 is the One Shot output 56.

At time $T_0$ (FIG. 3A), the Input Signal is still at ground potential. Since all of the FIG. 2 components are powered by the Input Signal $V_{cc}$, the remaining four signals of the FIG. 3A timing diagram will also be at ground potential. Further, since signal $\overline{ENABLE}$ is low, the output of inverter 29 will be high and essentially equal to the magnitude on the Input Signal since inverter 29 is also powered by the Input Signal $V_{cc}$. As will be explained, transistor 28 is non-conductive at this point. Transistor 26 functions essentially as a source follower circuit with the gate voltage being approximately equal to the Input Signal, with the source voltage following the gate voltage, and with the two voltages differing from one another by a relatively fixed voltage somewhat larger than the threshold voltage of transistor 26. However, at very low Input Signal levels, there is insufficient voltage for transistor 26 to function as a source follower.

As the Input Signal approaches time $T_1$, there will be very little current flowing through transistors 26 and 28 or resistor 30 so that the voltage output of the Translator circuit 16 will be at ground level. Coupling due to capacitor 31 will function to maintain the Translator circuit output on line 17 close to ground level at this stage of the sequence. Thus, the input of the Comparator circuit 12 on line 17 will be at a minimum level. In addition, at this point there is still insufficient voltage for transistor 21 of the Voltage Reference circuit 14 to be conductive. Since transistor 21 is off, there will be no voltage drop across resistor 24 so that the Voltage Reference output on line 15 will be equal to the Input Signal, as can be seen in FIG. 3A.

Although the Comparator circuit 12 is not fully functioning at this point, it can be seen that one input on line 17 is at a minimum value and the other input on line 15 is at a maximum value. This will tend to force most of the current from the tail current transistor 36 to output transistor 40 as opposed to transistor 38 thereby causing the Comparator output on line 13 to be at some maximum value. This will cause inverter 48 output to also be at a maximum value approaching the Input Signal as can be seen in FIG. 3A. This is important since the Comparator circuit 12 output (curve 54 of FIG. 3B) at this point in time is used as part of the Level Detection output for resetting various system elements and the output should be at a maximum value.

At about time $T_1$, the Input Signal is at a voltage approaching the threshold voltage of transistor 21. (The term threshold voltage of a transistor is used here to mean the gate-source voltage required to cause the transistor to conduct a drain-source current of 1 micro-ampere when the drain-source voltage is 1 volt.) The Voltage Reference( output on line 15 is at its final value and will thereafter be relatively independent of the Input Signal. The Comparator circuit output will continue to follow the Input Signal at this point, as also indicated by waveform 54 of FIG. 3B.

At time $T_2$, the voltage across the Translator transistor 26 will be sufficient for the transistor to become active. As can be seen in the FIG. 3A timing diagram, the Translator signal begins to increase at the same rate of increase as the Input Signal at this point. As can be seen from the FIG. 3A timing diagram, as the Input Signal magnitude increases, the output of the Voltage Reference remains relatively constant and independent of the Input Signal. This independence is enhanced by taking steps to ensure that the gate-source voltage of transistor 21 remains close to the threshold voltage of the transistor. This is done by minimizing the magnitude of the current flow through the transistor which can be achieved by using a large value of resistance for resistor 24. In addition, a large geometry transistor, that is, a large channel width to channel length ratio (W/L) will help ensure that the gate-source voltage remains close to the threshold voltage. In addition, by connecting the body of transistor 21 (the N well in which the transistor is formed) to the source, the threshold voltage of transistor 21 will remain constant and will not change due to the body effect.

Thus, at time $T_2$, the various circuits which make up the subject Level Detection circuit 10 will have sufficient voltage to function in some manner. Comparator circuit 12 will continue to provide the desired polarity output but will not be fully functional as a comparator until the Input Signal is at least equal to the sum of the threshold voltages of transistors 32 and 38. Up to this point, the magnitude of the Voltage Reference circuit output on line 15 will be larger than that of the Translator circuit 16 output on line 17. Essentially all of the current provided by tail current source transistor 36 will flow through input transistor 34 so that the output of the Comparator circuit 12 on line 13 will be at a "high" level approaching the magnitude of the supply voltage, that is, the magnitude on the Input Signal $V_{cc}$.

With a high Comparator circuit output, the output of inverter 43 on line 20 will be at a low level. This low level will keep hysteresis transistor 28 in an off state. In addition, the low level will not trigger One Shot 52 and the normally low output of the One Shot will remain low. The output of inverter 48 will also be high so that one input of OR gate 19 will be high. Thus, as can be seen from waveform 54 of the FIG. 3B timing diagram, the output of the Level Detection circuit 10 will be it a high level, at least as high as the Input Signal $V_{cc}$ will permit at this point in the power on sequence.

Eventually, at time $T_3$, the Input Signal has reached the predetermined level at which the subject Level Detection circuit 10 was designed to provide a pulse output. At this point, the Translator output has reached the same level as the Voltage Reference output. Comparator circuit 12 has sufficient gain so that all of the current from tail current source transistor 36 flowing into transistor 34 will switch to transistor 32. Thus, as can be seen from FIG. 3A, the output of the Comparator circuit on line 13 will switch from a high to a low state approaching the circuit common shortly after time $T_3$.

Inverter 43 will invert the Comparator output and the gain of the inverter will increase the rise and fall times of the signal. Inverter 43 will also convert the signal levels to be between approximately ground level and the Input Signal level $V_{cc}$. The output of inverter 43 is inverted again by inverter 48 and the falling edge of the output of inverter 48 will trigger One Shot 52. One Shot 52 will produce a positive output pulse of fixed duration as can be seen in FIG. 3A. As previously noted, the One Shot 52 output is ORed by gate 50 with the output of inverter 18, with this output being similar to the output of Comparator circuit 12 shown in FIG. 3A. The combined outputs which form the Detection Circuit 10 output are shown in the FIG. 3B timing diagram, with waveform 56 representing the contribution made by One Shot 52.

When Comparator circuit 12 changes state at time $T_3$, causing the output of inverter 43 on line 20 to go high, hysteresis transistor 28 will turn on. This will slightly increase the Translator circuit 16 output voltage on line 17, as can be seen in FIG. 3A. The positive feedback reinforces the increase in the Input Voltage $V_{cc}$ and prevents the Comparator circuit 12 from switching back to the original state should there be noise on the Input Signal just when the Comparator circuit is switching at time $T_3$.

It is possible that the system being initialized by the subject Level Detection circuit will begin to function in some respect before the Input Signal $V_{cc}$ reaches the trip point. Since the voltage at this point is very low, it is possible that improper functions will be carried out that will damage the system. For example, if the system is a memory, it is possible that erase circuitry will be improperly activated at low voltage which will erroneously erase some part of the memory. This problem is particularly acute when the supply voltage has a very slow rise time. Accordingly, it is often desirable to force the circuitry to a known state at very low voltages and to remove the resetting pulse well after the voltage is at a proper level. This is accomplished in the present case by ORing the Comparator output (as amplified by inverter 43, with the One Shot 52 output. The amplified Comparator output, represented by waveform 54 of FIG. 3B, will tend to hold the various system components in a reset state even for very slow Input Signal rise times and for low Input Signal levels. Once the Input Signal is at the predetermined trip point, the One Shot output pulse, as represented by waveform 56, will hold the system components in the reset state and will finally release the components at time $T_5$. Capacitors 23 and 31 will tend to filter the Input Signal Vcc so that narrow negative going voltage spikes on voltage Vcc will be less likely to trigger the subject Level Detection circuit.

When the Level Detection circuit is placed in a non-enabled mode of operation, signal $\overline{\text{ENABLE}}$ is inactive (high). Thus, the gate of transistor 22 will be low thereby turning off transistor 22 so as to disable the Voltage Reference circuit 14. In addition, transistor 42 will be conductive thereby disabling the Comparator circuit 12 and transistor 26 will be off thereby disabling the Translator circuit 16.

Thus, a novel level detection circuit has been disclosed. Although one embodiment has been described in some detail, it is to be understood that certain changes can be made by those skilled in the art without departing from the spirit and scope of the invention as defined by the appended claims. By way of example, the transistors can be replaced with complementary devices and the polarity of the supply voltages reversed.

We claim:

1. An integrated circuit, comprising:

a voltage reference circuit operably coupled to an input signal, wherein the voltage reference circuit produces a reference voltage;

a translator circuit operably coupled to the input signal, wherein the translator circuit produces a translated voltage;

a comparator circuit operably coupled to the voltage reference circuit and the translator circuit, wherein the comparator circuit produces a comparator output based on the comparison of the reference voltage and the translated voltage, further wherein the comparator output circuit causes the comparator output to have an original state prior to comparison of the reference voltage and the translated voltage, the comparator circuit causes the comparator output to assume a second state while the magnitude of the reference voltage is larger than the magnitude of the translated voltage, and the comparator circuit causes the comparator output to return to the original state when the magnitude of the translated voltage reaches the same level as the magnitude of the reference voltage; and a pulse shaper circuit operably coupled to the comparator circuit, wherein the pulse shaper circuit produces a resetting pulse of the second state in response to the comparator output assuming the second state, further wherein the resetting pulse maintains the second state for a fixed duration beyond when the comparator output returns to the original state.

2. The integrated circuit of claim 1 where in the input signal is the primary power supply voltage.

3. The integrated circuit of claim 1 wherein at least one of the voltage reference circuit, the translator circuit, the comparator circuit and the pulse shaper circuit is powered by the input signal.

4. The integrated circuit of claim 1 further comprising a positive feedback from the pulse shaper circuit to the translator circuit, wherein the positive feedback increases the magnitude of the translated voltage upon switching states of the comparator output from the second state to the original state.

5. The integrated circuit of claim 1 wherein at least one of the voltage reference circuit, the translator circuit and the comparator circuit is operably coupled to an enable signal capable of disabling each at least one coupled circuit.

6. The integrated circuit of claim 1 wherein the resetting pulse comprises a first waveform component following the comparator output and a second waveform component having an output pulse of fixed duration, further wherein the second waveform component is triggered upon switching states of the comparator output from the second state to the original state, still further wherein the first waveform component and the second waveform component are ORed to form the resetting pulse.

7. The integrated circuit of claim 6 further comprising a one shot circuit wherein the second waveform component is produced by the one shot circuit.

8. The integrated circuit of claim 6 wherein the magnitude of the translated voltage is selected to equal the magnitude of the reference voltage when the input signal is at a predetermined trip point level.

9. The integrated circuit of claim 8 wherein the reference voltage is relatively independent of the input signal when the magnitude of the input signal is above a minimum value, further wherein the minimum value is less than the magnitude of the predetermined trip point level.

10. An integrated circuit, comprising:
a voltage reference circuit operably coupled to a primary power supply voltage, wherein the voltage reference circuit produces a reference voltage;
a translator circuit operably coupled to the primary power supply voltage, wherein the translator circuit produces a translated voltage;
a comparator circuit operably coupled to the voltage reference circuit and the translator circuit, wherein the comparator circuit produces a comparator output based on the comparison of the reference voltage and the translated voltage, further wherein the comparator output circuit causes the comparator output to have an original state prior to comparison of the reference voltage and the translated voltage, the comparator circuit causes the comparator output to assume a second state while the magnitude of the reference voltage is larger than the magnitude of the translated voltage, and the comparator circuit causes the comparator output to return to the original state when the magnitude of the translated voltage reaches the same level as the magnitude of the reference voltage;

a pulse shaper circuit operably coupled to the comparator circuit, wherein the pulse shaper circuit produces a resetting pulse of the second state in response to the comparator output assuming the second state, further wherein the resetting pulse maintains the second state for a fixed duration beyond when the comparator output returns to the original state; and a positive feedback from the pulse shaper circuit to the translator circuit, wherein the positive feedback increases the magnitude of the translated voltage upon switching states of the comparator output from the second state to the original state.

11. An electronic system, comprising:
at least one system element powered by a power supply voltage having a proper level, wherein the at least one system element has a reset state;
a reset circuit operably coupled to the at least one system element, wherein the reset circuit is capable of detecting the magnitude of the power supply voltage, further wherein the reset circuit produces a resetting pulse in response to increasing magnitude of the power supply voltage following a time selected from the group consisting of at initial power on or after a power drop of the power supply voltage magnitude below the magnitude of the proper level, still further wherein the reset circuit maintains the resetting pulse for a fixed duration following the power supply voltage magnitude exceeding the magnitude of the proper level; and
wherein the at east one system element is forced to the reset state in response to the resetting pulse.

12. A method of resetting an electronic system element, comprising:
generating a reference voltage in response to an input signal;
generating a translated voltage in response to the input signal;
comparing the reference voltage and the translated voltage;
generating a compare signal in response to increasing input signal magnitude until the magnitude of the translated voltage reaches the magnitude of the reference voltage;
generating an output pulse of fixed duration upon the magnitude of the translated signal reaching the magnitude of the reference voltage;
producing a resetting pulse when at least one of the compare signal and the output pulse of fixed duration is present; and
providing the resetting pulse to the electronic system element, wherein the resetting pulse is suitable to force the electronic system element to a reset state.

13. The method of claim 12 wherein generating a reference voltage in response to an input signal and generating translated voltage in response to the input signal comprises an input signal that is the primary power supply voltage.

14. The method of claim 12 further comprising providing a positive feedback to the translated voltage upon the magnitude of the translated voltage reaching the magnitude of the reference voltage, wherein the positive feedback increases the magnitude of the translated voltage.

15. The method of claim 12 further comprising providing an enable signal.

16. The method of claim 12 wherein generating an output pulse of fixed duration comprises generating an output pulse of fixed duration using a one shot circuit.

17. The method of claim 12 wherein generating a compare signal in response to increasing input signal magnitude until the magnitude of the translated voltage reaches the magnitude of the reference voltage comprises a translated voltage selected such that the magnitude of the translated voltage is equal to the magnitude of the reference voltage when the input signal is at a predetermined trip point level.

18. A method of resetting an electronic system element, comprising:

- generating a reference voltage in response to a primary power supply voltage;
- generating a translated voltage in response to the primary power supply voltage;
- comparing the reference voltage and the translated voltage;
- providing a positive feedback to the translated voltage upon the magnitude of the translated voltage reaching the magnitude of the reference voltage, wherein the positive feedback increases the magnitude of the translated voltage;
- generating a compare signal in response to increasing input signal magnitude until the magnitude of the translated voltage reaches the magnitude of the reference voltage;
- generating an output pulse of fixed duration upon the magnitude of the translated signal reaching the magnitude of the reference voltage;
- producing a resetting pulse when at least one of the compare signal and the output pulse of fixed duration is present; and
- providing the resetting pulse to the electronic system element, wherein the resetting pulse is suitable to force the electronic system element to a reset state.

19. An integrated circuit, comprising:

- a voltage reference circuit having a voltage reference circuit input and a voltage reference circuit output, wherein he voltage reference circuit input is connected to an input signal, further wherein the voltage reference circuit produces a reference voltage on the voltage reference circuit output;
- a translator circuit having a translator circuit input and a translator circuit output, wherein the translator circuit input is connected to the input signal, further wherein the translator circuit produces a translated voltage on the translator circuit output;
- a comparator circuit having a first input, a second input and a comparator circuit output, wherein the first input is connected to the voltage reference circuit output, further wherein the second input is connected to the translator circuit output, still further wherein the comparator circuit produces a comparator output based on the comparison of the reference voltage and the translated voltage, still further wherein the comparator circuit causes the comparator output to have an original state selected from the group consisting of high and low at a time selected from the group consisting of at initial power on or after a power drop of the power supply voltage magnitude below the magnitude of a proper level, the comparator circuit causes the comparator output to assume a second state while the magnitude of the reference voltage is larger than the magnitude of the translated voltage, and the comparator circuit causes the comparator output to return to the original state when the magnitude of the translated voltage reaches the same level as the magnitude of the reference voltage; and
- a pulse shaper circuit having a third input and a detection circuit output, wherein the third input is connected to the comparator circuit output, further wherein the pulse shaper circuit produces a resetting pulse, wherein the resetting pulse comprises a first waveform component following the comparator output and a second waveform component having an output pulse of fixed duration, further wherein the second waveform component is triggered upon switching states of the comparator output from the second state to the original state, still further wherein the first waveform component and the second waveform component are ORed to form the resetting pulse.

20. The integrated circuit of claim 19 wherein the input signal is the primary power supply voltage.

21. The integrated circuit of claim 19 wherein the voltage reference circuit, the translator circuit, the comparator circuit and the pulse shaper circuit are powered by the input signal.

22. The integrated circuit of claim 19 further comprising a feedback output of the pulse shaper circuit and a hysteresis transistor input of the translator circuit, wherein feedback output is operably coupled to the, hysteresis transistor input, further wherein a positive feedback output signal is produced by the pulse shaper circuit on the feedback output in response to the switching of the comparator output from the second state to the original state, still further wherein the positive feedback output signal causes the translator circuit to increase the magnitude of the translated voltage.

23. The integrated circuit of claim 19 wherein at least one of the voltage reference circuit, the translator circuit and the comparator circuit is operably coupled to an enable signal capable of disabling each at least one coupled circuit.

24. The integrated circuit of claim 19 wherein the pulse shaper circuit further comprises a one shot circuit, further wherein the second waveform component is produced by the one shot circuit.

25. The integrated circuit of claim 19 wherein the magnitude of the translated voltage is selected to equal the magnitude of the reference voltage when the input signal is at a predetermined trip point level.

26. The integrated circuit of claim 25 wherein the reference voltage is relatively independent of the input signal when the magnitude of the input signal is above a minimum value, further wherein the minimum value is less than the magnitude of the predetermined trip point level.

27. An electronic system, comprising:

- at least one system element powered by an input signal having a proper level, wherein the at least one system element has a reset state;
- a voltage reference circuit operably coupled to the input signal, wherein the voltage reference circuit produces a reference voltage;
- a translator circuit operably coupled to the input signal, wherein the translator circuit produces a translated voltage;
- a comparator circuit operably coupled to the voltage reference circuit and the translator circuit, wherein the comparator circuit produces a comparator output based on the comparison of the reference voltage and the translated voltage following a time selected from the group consisting of at initial power on or after a power drop of the input signal magnitude below the magnitude of the proper level, further wherein the comparator output circuit causes the comparator output to have an original state prior to comparison of the reference voltage and the translated voltage, the comparator circuit causes the comparator output to assume a second state while the magnitude of the reference voltage is larger than the magnitude of the translated voltage, and the comparator circuit causes the comparator output to return to the original state when the magnitude of the translated voltage reaches the same level as the magnitude of the reference voltage;

a pulse shaper circuit operably coupled to the comparator circuit and the at least one system element, wherein the pulse shaper circuit produces a resetting pulse in response to the comparator output, further wherein the resetting pulse follows the comparator output while the magnitude of the reference voltage is larger than the magnitude of the translated voltage, still further wherein the resetting pulse maintains the second state for a fixed duration beyond when the magnitude of the translated voltage reaches the same level as the magnitude of the reference voltage; and wherein the at least one system element is forced to the reset state in response to the resetting pulse.

28. The electronic system of claim 27 wherein the input signal is the primary power supply voltage.

29. The electronic system of claim 27 wherein the voltage reference circuit, the translator circuit, the comparator circuit and the pulse shaper circuit are powered by the input signal.

30. The electronic system of claim 27 wherein the pulse shaper circuit is further operably coupled to the translator circuit, further wherein the pulse shaper circuit produces a positive feedback upon switching states of the comparator output from the second state to the original state, still further wherein the translator circuit increases the magnitude of the translated voltage in response to the positive feedback.

31. The electronic system of claim 27 wherein at least one of the voltage reference circuit, the translator circuit and the comparator circuit is operably coupled to an enable signal capable of disabling each at least one coupled circuit.

32. The electronic system of claim 27 wherein the resetting pulse comprises a first waveform component following the comparator output and a second waveform component having an output pulse of fixed duration, further wherein the second waveform component is triggered upon switching states of the comparator output from the second state to the original state, still further wherein the first waveform component and the second waveform component are ORed to form the resetting pulse.

33. The electronic system of claim 32 wherein the pulse shaper circuit further comprises a one shot circuit, further wherein the second waveform component is produced by the one shot circuit.

34. The electronic system of claim 27 wherein the magnitude of the translated voltage is selected to equal the magnitude of the reference voltage when the input signal is at a predetermined trip point level.

35. The electronic system of claim 34 wherein the reference voltage is relatively independent of the input signal when the magnitude of the input signal is above a minimum value, further wherein the minimum value is less than the magnitude of the predetermined trip point level.

36. An electronic system, comprising:

at least one system element powered by an input signal having a proper level, wherein the at least one system element has a reset state;

a voltage reference circuit operably coupled to the input signal, wherein the voltage reference circuit produces a reference voltage;

a translator circuit operably coupled to the input signal, wherein the translator circuit produces a translated voltage;

a comparator circuit operably coupled to the voltage reference circuit and the translator circuit, wherein the comparator circuit produces a comparator output based on the comparison of the reference voltage and the translated voltage following a time selected from the group consisting of at initial power on or after a power drop of the input signal magnitude below the magnitude of the proper level, further wherein the comparator output circuit causes the comparator output to have an original state prior to comparison of the reference voltage and the translated voltage, the comparator circuit causes the comparator output to assume a second state while the magnitude of the reference voltage is larger than the magnitude of the translated voltage, and the comparator circuit causes the comparator output to return to the original state when the magnitude of the translated voltage reaches the same level as the magnitude of the reference voltage;

a pulse shaper circuit operably coupled to the comparator circuit and the at least one system element, wherein the pulse shaper circuit produces a resetting pulse of the second state in response to the comparator output assuming the second state, further wherein the resetting pulse maintains the second state for a fixed duration beyond when the comparator output returns to the original state; and wherein the at least one system element is forced to the reset state in response to the resetting pulse.

37. The electronic system of claim 36 wherein the fixed duration is chosen to assure that the at least one system element maintains the reset state until after the input signal reaches the proper level, further wherein the proper level of the input signal is a level necessary for proper operation of the at least one system element.

* * * * *